(12) United States Patent
Adachi et al.

(10) Patent No.: US 10,743,414 B2
(45) Date of Patent: Aug. 11, 2020

(54) RESIN MULTILAYER SUBSTRATE AND METHOD OF MANUFACTURING THE SAME

(71) Applicant: Murata Manufacturing Co., Ltd., Nagaokakyo-shi, Kyoto-fu (JP)

(72) Inventors: Toshiro Adachi, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/935,249

(22) Filed: Mar. 26, 2018

(65) Prior Publication Data

US 2018/0213643 A1    Jul. 26, 2018

Related U.S. Application Data

(63) Continuation of application No. PCT/JP2016/080500, filed on Oct. 14, 2016.

(30) Foreign Application Priority Data

Nov. 10, 2015  (JP) ................................ 2015-220363
Jun. 23, 2016  (JP) ................................ 2016-124677

(51) Int. Cl.
    *H05K 1/11*    (2006.01)
    *H05K 1/09*    (2006.01)
    (Continued)

(52) U.S. Cl.
    CPC ........... *H05K 1/092* (2013.01); *H05K 1/0353* (2013.01); *H05K 1/115* (2013.01); *H05K 3/06* (2013.01);
    (Continued)

(58) Field of Classification Search
    CPC ........ H05K 1/115; H05K 1/116; H05K 1/113; H05K 1/092; H05K 3/4632; H05K 3/4644;
    (Continued)

(56) References Cited

U.S. PATENT DOCUMENTS 6,713,687 B2 *  3/2004  Yazaki ................. H05K 3/4069
                                                174/260
7,190,078 B2 *  3/2007  Khandekar ........... H01L 21/486
                                                257/621
(Continued)

FOREIGN PATENT DOCUMENTS

JP    2003-023250 A    1/2003
JP    2003-338691 A    11/2003
(Continued)

OTHER PUBLICATIONS

English Translation JP2005-019601 (Year: 2005).*
(Continued)

*Primary Examiner* — Steven T Sawyer
(74) *Attorney, Agent, or Firm* — Keating & Bennett, LLP

(57) ABSTRACT

A resin multilayer substrate includes a first resin layer including a thermoplastic resin as a main material, a second resin layer including the thermoplastic resin as a main material and superposed on the first resin layer, a first interlayer-connection conductor passing through the first resin layer in a thickness direction, and a first conductor pattern at an area including a region in which the first interlayer-connection conductor is exposed at the surface of the first resin layer between the first resin layer and the second resin layer. The first conductor pattern includes a portion in or at which a portion of the first interlayer-connection conductor is disposed. The first conductor pattern includes a first portion covering the region exposed at the surface of the first resin layer; and a second portion
(Continued)

disposed surrounding the first portion. The first portion and the second portion have different thicknesses from each other.

19 Claims, 9 Drawing Sheets

(51) Int. Cl.
*H05K 3/46* (2006.01)
*H05K 1/03* (2006.01)
*H05K 3/06* (2006.01)
*H05K 3/40* (2006.01)

(52) U.S. Cl.
CPC ......... *H05K 3/4632* (2013.01); *H05K 3/4644* (2013.01); *H05K 1/116* (2013.01); *H05K 3/4069* (2013.01); *H05K 3/4617* (2013.01); *H05K 2201/0129* (2013.01); *H05K 2201/0141* (2013.01); *H05K 2201/096* (2013.01); *H05K 2201/0969* (2013.01); *H05K 2201/09527* (2013.01); *H05K 2201/09736* (2013.01); *H05K 2201/09745* (2013.01); *H05K 2201/09827* (2013.01); *H05K 2203/0156* (2013.01); *H05K 2203/0353* (2013.01)

(58) Field of Classification Search
CPC ................... H05K 3/06; H05K 1/0353; H05K 2201/09736; H05K 3/4617; H05K 2201/09745; H05K 2201/0969; H05K 2201/09527; H05K 2203/0156; H05K 2203/0353; H05K 2201/09827; H05K 2201/096; H05K 2201/0141; H05K 2201/0129; H05K 3/4069
See application file for complete search history.

(56) References Cited

U.S. PATENT DOCUMENTS

| | | | | |
|---|---|---|---|---|
| 7,956,293 | B2* | 6/2011 | Echigo | H05K 3/4069 174/262 |
| 2003/0007330 | A1 | 1/2003 | Kondo | |
| 2005/0155792 | A1* | 7/2005 | Ito | H05K 3/4069 174/264 |
| 2006/0274510 | A1* | 12/2006 | Nakada | H05K 3/4069 361/748 |
| 2008/0179744 | A1* | 7/2008 | Yu | H01L 21/6835 257/750 |
| 2008/0264684 | A1* | 10/2008 | Kang | H05K 3/205 174/262 |
| 2010/0224395 | A1* | 9/2010 | Higashitani | H05K 3/462 174/258 |
| 2013/0299219 | A1 | 11/2013 | Chisaka et al. | |
| 2014/0097009 | A1* | 4/2014 | Kaneko | H01L 23/49822 174/258 |

FOREIGN PATENT DOCUMENTS

| | | |
|---|---|---|
| JP | 2004-311926 A | 11/2004 |
| JP | 2005-019601 A | 1/2005 |
| JP | 2009-212101 A | 9/2009 |
| JP | 2010-212345 A | 9/2010 |
| JP | 2011-187843 A | 9/2011 |
| WO | 2012/111711 A1 | 8/2012 |

OTHER PUBLICATIONS

Official Communication issued in International Patent Application No. PCT/JP2016/080500, dated Dec. 20, 2016.
Official Communication issued in Japanese Patent Application No. 2017-550033, dated Sep. 11, 2018.
Official Communication issued in corresponding Japanese Patent Application No. 2017-550033, dated Feb. 12, 2019.

* cited by examiner

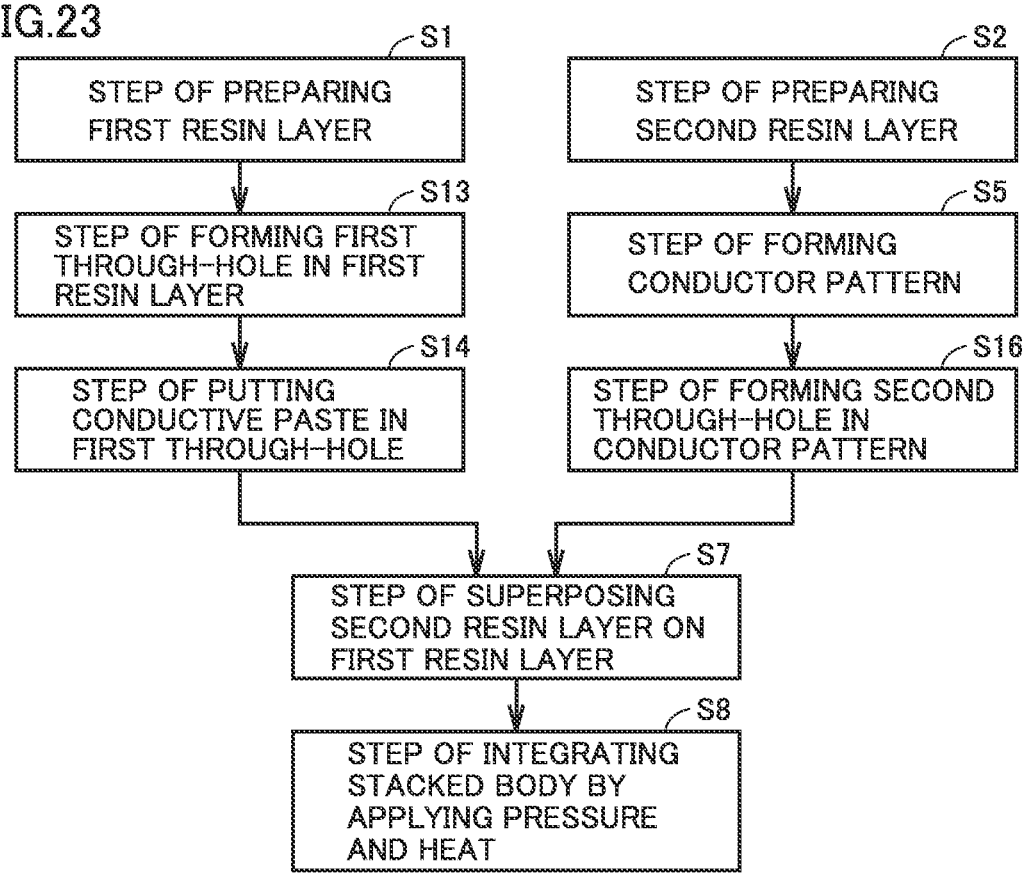

RESIN MULTILAYER SUBSTRATE AND METHOD OF MANUFACTURING THE SAME

CROSS REFERENCE TO RELATED APPLICATIONS

This application claims the benefit of priority to Japanese Patent Application No. 2015-220363 filed on Nov. 10, 2015 and Japanese Patent Application No. 2016-124677 filed on Jun. 23, 2016, and is a Continuation Application of PCT Application No. PCT/JP2016/080500 filed on Oct. 14, 2016. The entire contents of each application are hereby incorporated herein by reference.

BACKGROUND OF THE INVENTION

1. Field of the Invention

The present invention relates to a resin multilayer substrate and a method of manufacturing the same.

2. Description of the Related Art

WO 2012/111711 describes a multilayer circuit board produced by stacking resin sheets including a thermoplastic resin, with a conductor wiring layer made of a conductive foil being formed on the surface thereof. Via hole conductors inside this multilayer circuit board are formed of a conductive paste including, for example, Sn.

The multilayer circuit board described in WO 2012/111711 is produced by stacking resin sheets and, therefore, is a resin multilayer substrate. In the resin multilayer substrate, an interlayer-connection conductor is used for electrically connecting conductor patterns that are separated from each other in the thickness direction. A conductive paste, which is a precursor of the interlayer-connection conductor, may contain a low-melting metal, such as Sn. With the use of a conductive paste including a low-melting metal such as Sn, when heat and pressure are applied for pressure-bonding a stack of a plurality of resin sheets, the low-melting metal oozes out of the conductive paste portion, which is to be formed into the interlayer-connection conductor, and spreads over gaps between the resin layers. As a result, the oozed low-melting metal disadvantageously causes an undesired electrical continuity between conductor patterns, causing a short-circuit failure.

Such a short-circuit failure due to the oozed metal is especially likely to occur for a short distance between adjacent conductor patterns having different electric potentials. If a low-melting metal such as Sn is not added to a conductive paste to prevent the oozing, however, metallization of an interlayer-connection conductor would become difficult in a step of stacking a plurality of resin sheets including a thermoplastic resin and applying pressure to the stack while heating it to higher than or equal to the softening temperature of the thermoplastic resin.

SUMMARY OF THE INVENTION

Preferred embodiments of the present invention provide resin multilayer substrates and methods of manufacturing the same that prevent a short-circuit failure due to oozing of a conductive paste, which defines an interlayer-connection conductor.

A resin multilayer substrate according to a preferred embodiment of the present invention includes a first resin layer including a thermoplastic resin as a main material; a second resin layer including the thermoplastic resin as a main material and superposed on the first resin layer; a first interlayer-connection conductor passing through the first resin layer in the thickness direction; and a first conductor pattern at an area including a region in which the first interlayer-connection conductor is exposed at the surface of the first resin layer between the first resin layer and the second resin layer. The first conductor pattern includes a portion in or at which a portion of the first interlayer-connection conductor is disposed.

According to preferred embodiments of the present invention, a portion of the first interlayer-connection conductor is disposed in or at the first conductor pattern, and thus, the conductive paste is prevented from spreading to other undesired portions. Therefore, short-circuit failures due to the oozing of the conductive paste are prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 23 is a flowchart of the method of manufacturing a resin multilayer substrate in Preferred Embodiment 4 according to the present invention.

DETAILED DESCRIPTION OF THE PREFERRED EMBODIMENTS

Figure 1:
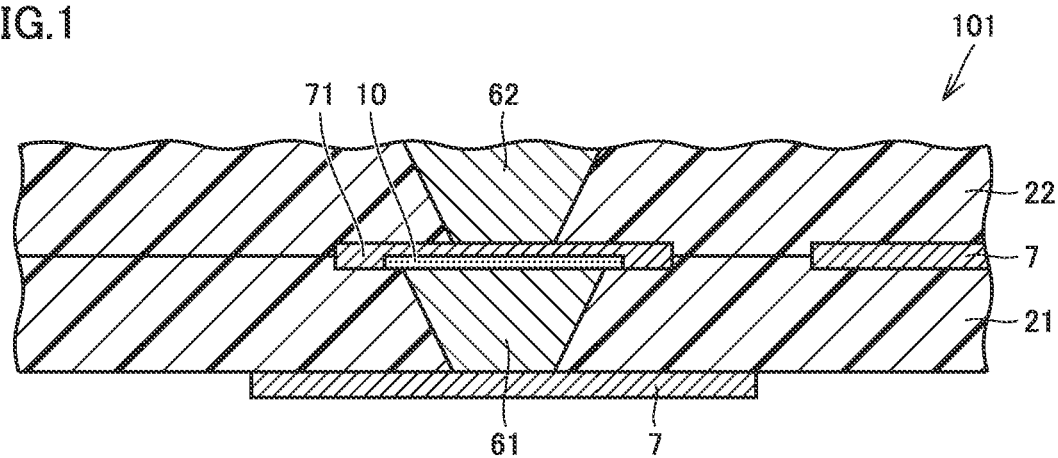
FIG. 1 is a partial cross-sectional view of a resin multilayer substrate in Preferred Embodiment 1 according to the present invention.

The scale ratios shown in the drawings are not necessarily true and actual ratios but may be exaggerated for the purpose of illustration. In the description below, when reference is made to the concept of "upper" or "lower", it does not necessarily mean absolute "upper" or "lower" but may mean relative "upper" or "lower" with respect to the configuration shown in the drawings.

Preferred Embodiment 1

Figure 2:
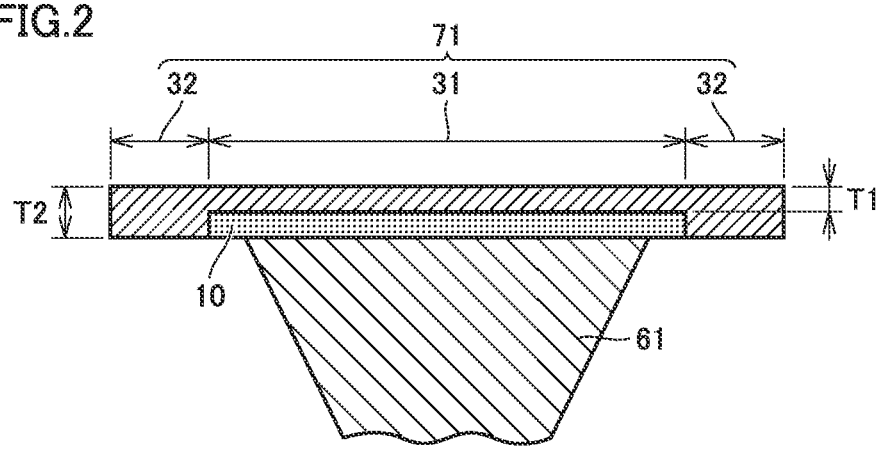
FIG. 2 is an enlarged view of a first conductor pattern and its vicinity shown in FIG. 1.

With reference to FIG. 1 and FIG. 2, a resin multilayer substrate in Preferred Embodiment 1 according to the present invention is described. A partial cross-sectional view of a resin multilayer substrate 101 in the present preferred embodiment is shown in FIG. 1.

Resin multilayer substrate 101 includes a first resin layer 21 including a thermoplastic resin as a main material, a second resin layer 22 including a thermoplastic resin as a main material and superposed on first resin layer 21, a first interlayer-connection conductor 61 passing through first resin layer 21 in the thickness direction, and a first conductor pattern disposed at an area including a region in which first interlayer-connection conductor 61 is exposed at the surface of first resin layer 21 between first resin layer 21 and second resin layer 22. First conductor pattern 71 includes a first portion 31 covering the region in which first interlayer-connection conductor 61 is exposed at the surface of first resin layer 21, and a second portion 32 surrounding first portion 31. Each of first resin layer 21 and second resin layer 22 preferably includes, for example, a liquid crystal polymer resin. First conductor pattern 71 preferably includes a metallic foil, such as a copper foil. First interlayer-connection conductor 61 is a solidified conductive paste preferably including, for example, Sn. The thickness of first conductor pattern 71 is different between first portion 31 and second portion 32. First conductor pattern 71 and its vicinity of FIG. 1 is shown in FIG. 2 in an enlarged view. In the example shown in FIG. 1 and FIG. 2, T1<T2 is preferably satisfied where T1 denotes the thickness of first conductor pattern 71 at first portion 31 and where T2 denotes the thickness of first conductor pattern 71 at second portion 32. Although this relationship may be inversed, the case of T1<T2 is specifically described below in the present preferred embodiment.

In the present preferred embodiment, first portion 31 is thinner than second portion 32 in thickness, and the surface of first portion 31 adjacent to first resin layer 21 is recessed in the thickness direction compared to the surface of second portion 32 adjacent to first resin layer 21. A portion 10 is provided under first portion 31. In portion 10, a portion of the conductive paste of first interlayer-connection conductor 61 is collected. Here, the drawings schematically show that portion 10 is filled with a conductive paste alone. In practice, however, portion 10 is not necessarily filled with only a conductive paste, but a material of first interlayer-connection conductor 61 and a material of first resin layer 21 may also present in portion 10.

In the present preferred embodiment, first conductor pattern 71, which is disposed at an area including a region in which first interlayer-connection conductor 61 is exposed at the surface of first resin layer 21, includes first portion 31 and second portion 32 having different thicknesses. Accordingly, if the conductive paste of first interlayer-connection conductor 61 includes a low-melting metal, such as Sn, and the conductive paste partially oozes, the conductive paste will collect in a stepped portion provided by the difference in thickness between first portion 31 and second portion 32. The conductive paste is thus prevented from spreading to other undesired portions. Therefore, a short-circuit failure due to the oozing of the conductive paste is effectively prevented.

In the present preferred embodiment, since first portion 31 is thinner than second portion 32, the conductive paste that has oozed will collect in portion 10 shown in FIG. 1. Since portion 10 is surrounded by second portion 32, the conductive paste that in portion 10 is prevented from spreading to the outside of second portion 32.

Preferably, the first interlayer-connection conductor includes an added metal having a melting point lower than the softening temperature of the thermoplastic resin included in first resin layer 21 as a main material. Although in such a case the added metal is highly likely to ooze during a thermocompression bonding step, the present preferred embodiment more effectively achieves the advantageous effects. This is because first conductor pattern 71 is provided with portions having different thicknesses so that the added metal that has oozed is contained.

The added metal is preferably Sn, for example. Such a configuration facilitates full metallization (solidification) of the first interlayer-connection conductor in a step of applying pressure while applying heat to a temperature equal to or higher than the softening temperature of the thermoplastic resin. Further, since the oozed Sn is introduced into and contained in the space defined by the reduced-thickness portion in first conductor pattern 71, the advantageous effects are more noticeably achieved. Further, in the case in which first conductor pattern 71 is a copper foil, an intermetallic compound (e.g. $Cu_6Sn_5$) layer and/or a Cu—Sn alloy layer is able to be formed with the added metal, Sn. This allows a strong connection between first conductor pattern 71 and first interlayer-connection conductor 61. Forming such an intermetallic compound layer and/or an alloy layer also causes an increase in melting point compared to elemental Sn, and thus, causes a decrease in fluidity. Therefore, Sn, a low-melting metal, is able to be prevented from oozing.

The thermoplastic resin is preferably a liquid crystal polymer resin (also referred to as "LCP resin"), for example. By using LCP resin, a resin multilayer substrate with excellent high-frequency characteristics is thus obtained.

Figure 3:
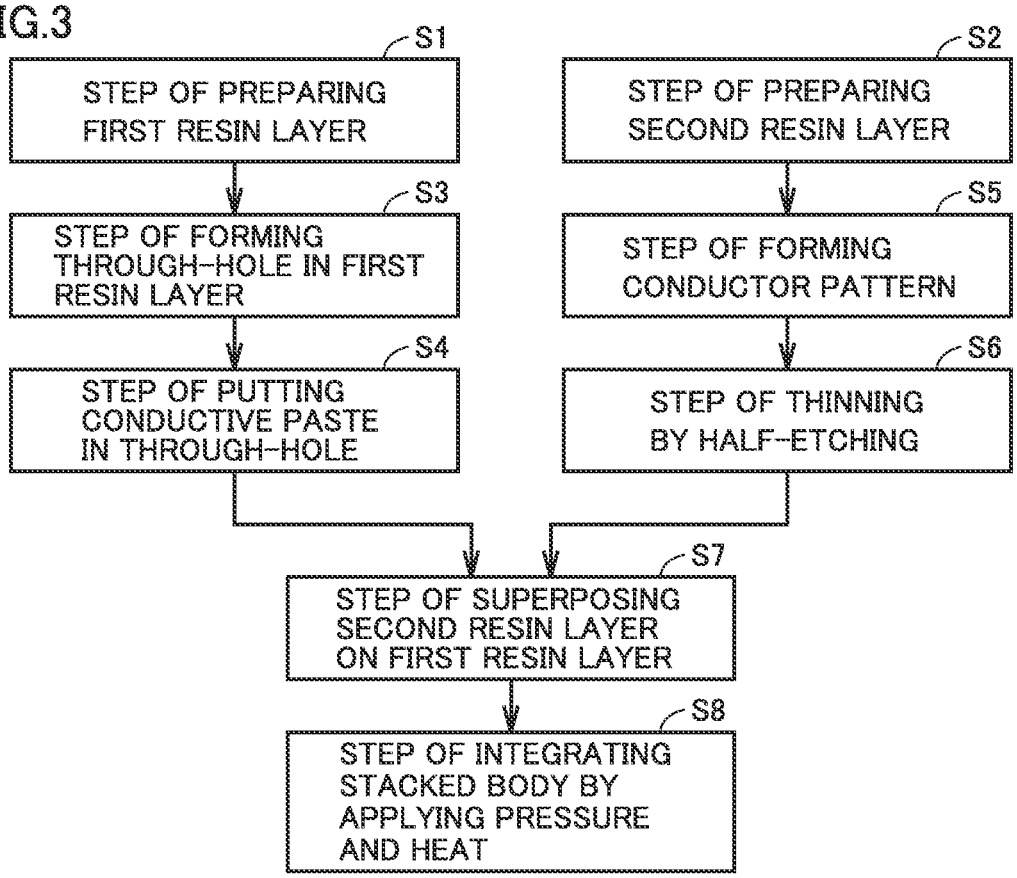
FIG. 3 is a flowchart of a method of manufacturing a resin multilayer substrate in Preferred Embodiment 1 according to the present invention.

With reference to FIG. 3 to FIG. 11, a non-limiting example of a method of manufacturing a resin multilayer substrate in Preferred Embodiment 1 according to the present invention is described. A flowchart of the non-limiting example of a method of manufacturing a resin multilayer substrate in the present preferred embodiment is shown in FIG. 3.

The method of manufacturing a resin multilayer substrate in the present preferred embodiment includes a step S1 of preparing a first resin layer including a thermoplastic resin as a main material; a step S2 of preparing a second resin layer including the thermoplastic resin as a main material and having a surface with a conductive film disposed thereon; a step S3 of forming a through-hole in the first resin layer; a step S4 of providing a conductive paste in the through-hole; a step S5 of forming a conductor pattern by patterning the conductive film of the second resin layer; a step S6 of thinning, by half-etching, any one of an outer peripheral portion of the conductor pattern and a portion surrounded by the outer peripheral portion; a step S7 of superposing the second resin layer on the first resin layer so that the conductor pattern covers a region of a surface of the first resin layer in which the through-hole is exposed, with the outer peripheral portion surrounding the exposed region; and a step S8 of integrating a stacked body including the first resin layer and the second resin layer by applying pressure to the stacked body while heating it to a temperature equal to or higher than the softening temperature of the thermoplastic resin.

Although step S1 to step S6 have been shown in this order for the purpose of illustration, the order of step S1 to step S6 is not so limited. For example, the timing of performing step S2 may be before step S1, or after step S4, or between step S3 and step S4. For example, the timing of performing steps S3 and S4 may be after step S6 or between step S5 and step S6. As shown in the flowchart of FIG. 3, the flow of steps S1, S3, and S4 and the flow of steps S2, S5, and S6 are separated from each other. Accordingly, one of the flows may be performed after the other, or both flows may be performed in parallel, for example.

Some of the steps with be described in detail below. Here, a case of obtaining resin multilayer substrate 101 is described as an example. In practice, an object to be manufactured in this method is not limited to resin multilayer substrate 101.

Figure 4:
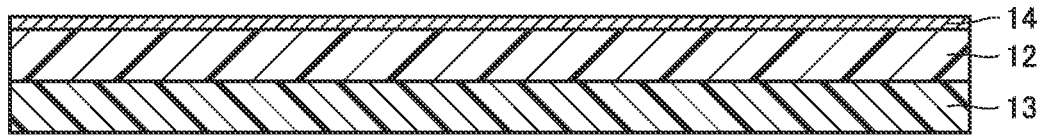
FIG. 4 is an illustrative diagram of a first step of the method of manufacturing a resin multilayer substrate in Preferred Embodiment 1 according to the present invention.

As step S2, as shown in FIG. 4, a stack is prepared in which a resin sheet 12 is disposed on a surface of a PET film 13, and a metallic foil is disposed on a surface of resin sheet 12 opposite to PET film 13. In the present preferred embodiment, a stack in which a copper foil 14 is disposed as an example of the metallic foil is prepared. Resin sheet 12 includes a thermoplastic resin as a main material. The thermoplastic resin may preferably be, for example, a liquid crystal polymer resin. Copper foil 14 may cover the entire surface of resin sheet 12. PET film 13 is a layer defining a supporting layer. The stack prepared as above from which PET film 13 is excluded is second resin layer 22.

Figure 5:
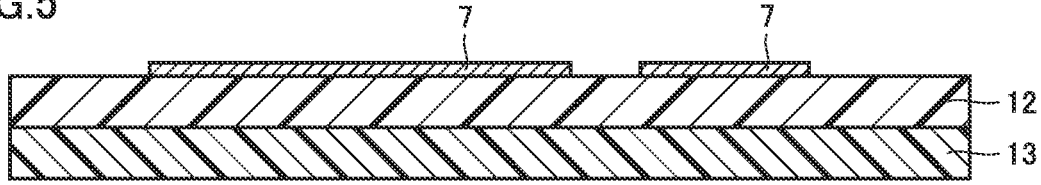
FIG. 5 is an illustrative diagram of a second step of the method of manufacturing a resin multilayer substrate in Preferred Embodiment 1 according to the present invention.

As step S5, copper foil 14 is subjected to photolithography. As a result, as shown in FIG. 5, copper foil 14 partially remains and forms a conductor pattern 7. Here, conductor patterns 7 having various sizes and shapes may preferably be formed. FIG. 5 shows, however, only two conductor patterns 7, a smaller one and a larger one, for the purpose of illustration.

Figure 6:
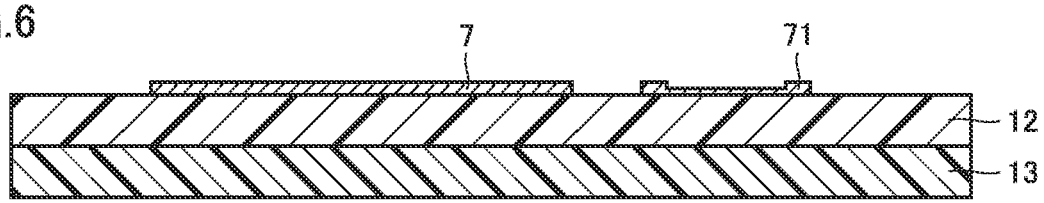
FIG. 6 is an illustrative diagram of a third step of the method of manufacturing a resin multilayer substrate in Preferred Embodiment 1 according to the present invention.

As step S6, conductor pattern 7 is partially subjected to half-etching. In other words, conductor pattern 7 is etched to become partially thin. In this manner, first conductor pattern 71 is formed as shown in FIG. 6. First conductor pattern 71 is the remainder as a result of the partial removal of the material from original conductor pattern 7. In step S6, not all of conductor patterns 7 are necessarily subjected to the half-etching. At the end of the half-etching, there may be another conductor pattern 7 remaining in an original state as shown in FIG. 6.

Figure 7:
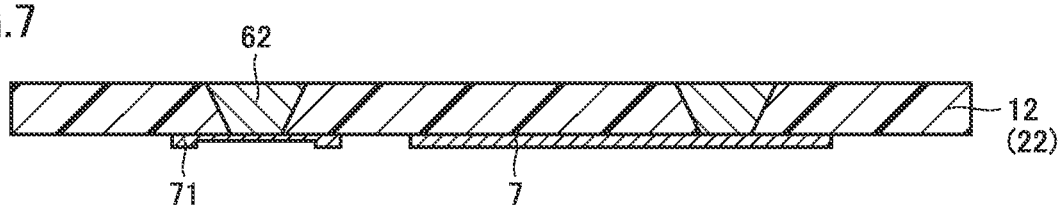
FIG. 7 is an illustrative diagram of a fourth step of the method of manufacturing a resin multilayer substrate in Preferred Embodiment 1 according to the present invention.

From the state shown in FIG. 6, a structure shown in FIG. 7 is obtained by forming a through-hole by, for example, laser machining; filling the through-hole with a conductive paste; and removing PET film 13. Second resin layer 22 shown in FIG. 7 includes first conductor pattern 71 and second interlayer-connection conductor 62. As shown in FIG. 7, there may be another conductor pattern 7 that does not include a reduced-thickness portion.

Figure 8:
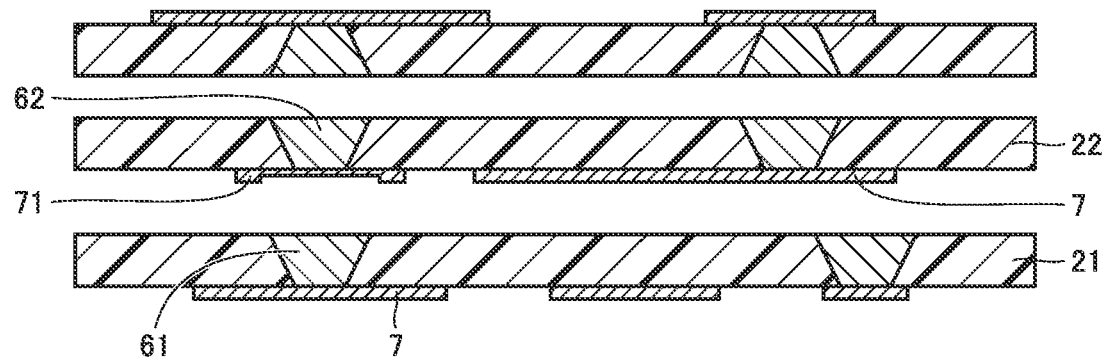
FIG. 8 is an illustrative diagram of a fifth step of the method of manufacturing a resin multilayer substrate in Preferred Embodiment 1 according to the present invention.
Figure 9:
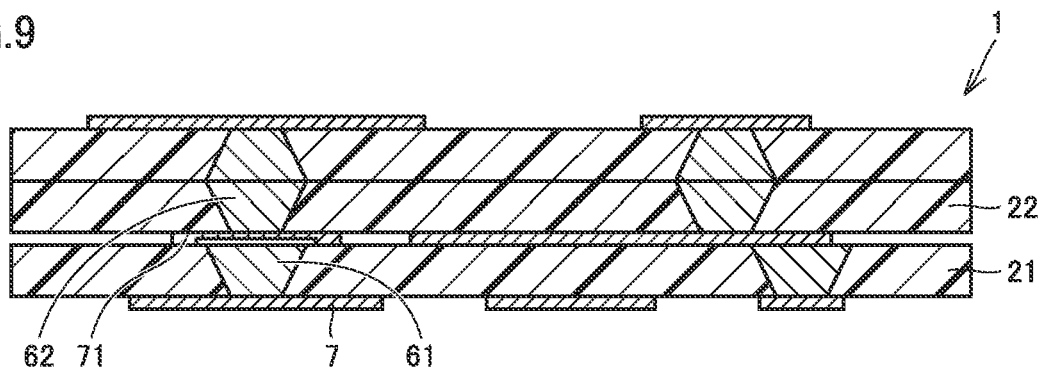
FIG. 9 is an illustrative diagram of a sixth step of the method of manufacturing a resin multilayer substrate in Preferred Embodiment 1 according to the present invention.
Figure 10:
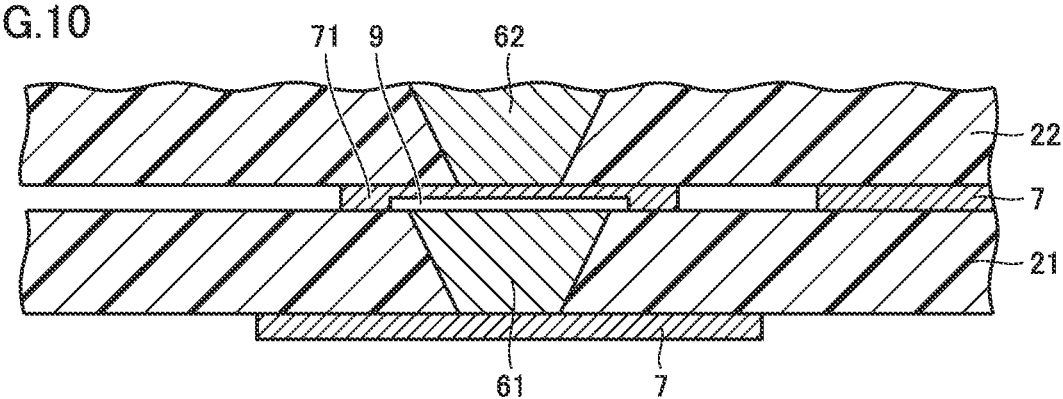
FIG. 10 is an enlarged view of a first conductor pattern and its vicinity shown in FIG. 9.

As step S7, as shown in FIG. 8, second resin layer 22 is superposed on first resin layer 21. At this time, a resin layer other than these two resin layers may also be superposed. In FIG. 8, a total of three resin layers are stacked. The number of the resin layers, however, may be other than three and may be any number equal to or greater than two. The stacked state is shown in FIG. 9. Of a stacked body 1 shown in FIG. 9, first conductor pattern 71 and its vicinity is shown in FIG. 10 in an enlarged view. A gap 9 is created under first conductor pattern 71.

Figure 11:
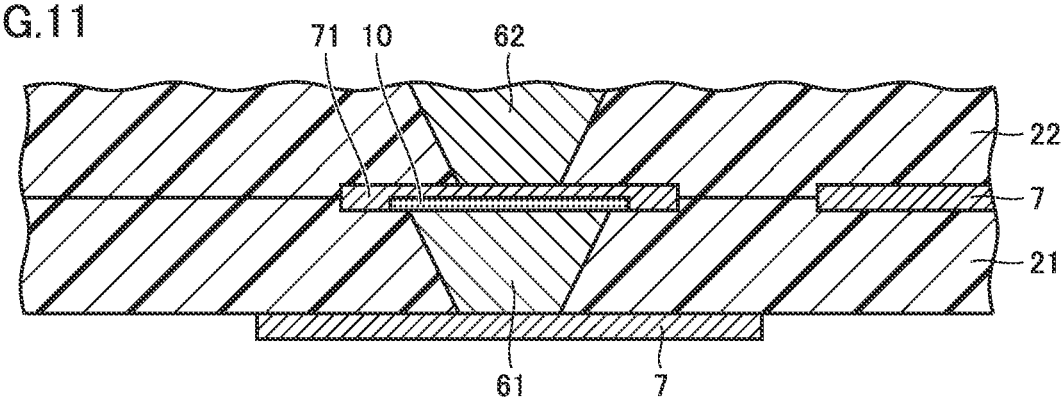
FIG. 11 is an enlarged view of a first conductor pattern and its vicinity when a conductive paste has further oozed from the state of FIG. 10.

As step S8, stacked body 1 is subjected to pressure while being heated to a temperature equal to or higher than the softening temperature of the thermoplastic resin. At this time, the conductive paste that has oozed from first interlayer-connection conductor 61 is contained in gap 9 under first conductor pattern 71. As a result, portion 10 is formed above first interlayer-connection conductor 61 as shown in FIG. 11. Portion 10 may be formed of the conductive paste alone or may be formed of a mixture of the conductive paste and other materials.

In the present preferred embodiment, the resin layers are stacked in step S7, with first conductor pattern 71 included in second resin layer 22 being provided with first portion 31 and second portion 32 having different thicknesses. Accordingly, if the conductive paste of first interlayer-connection conductor 61 includes a low-melting metal and this conductive paste partially oozes in step S8, the conductive paste will collect in a stepped portion created by the difference in thickness between first portion 31 and second portion 32. Accordingly, the conductive paste is prevented from spreading to other undesired portions, and thus, provides a resin multilayer substrate while preventing a short-circuit failure due to the oozing of the conductive paste.

In the method of manufacturing a resin multilayer substrate in the present preferred embodiment, the conductive paste preferably includes an added metal having a melting point lower than the softening temperature. Although in such a case, the added metal is highly likely to ooze in step S8, the present preferred embodiment more effectively achieves the advantageous effects. This is because first conductor pattern 71 is provided with portions having different thicknesses, so that the added metal that has oozed is able to be contained.

Preferred Embodiment 2

Figure 12:
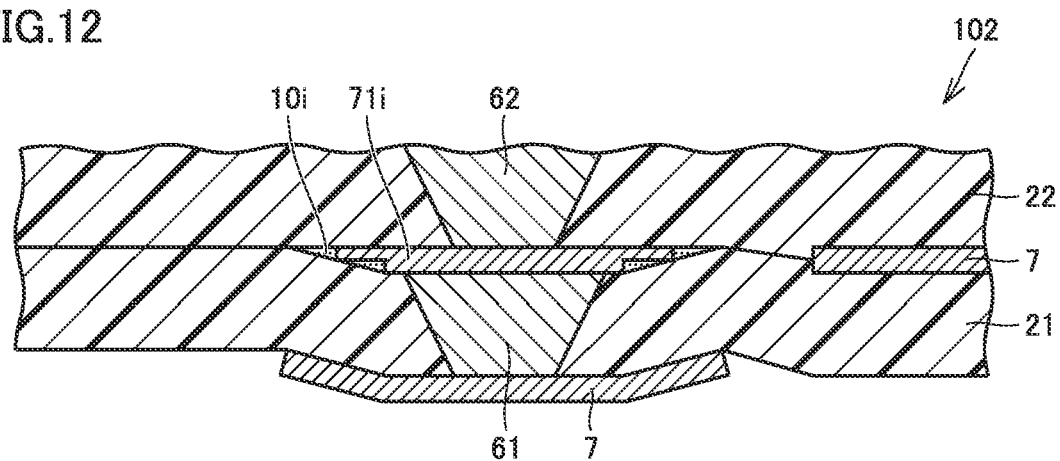
FIG. 12 is a partial cross-sectional view of a resin multilayer substrate in Preferred Embodiment 2 according to the present invention.

With reference to FIG. 12, a resin multilayer substrate in Preferred Embodiment 2 according to the present invention is described. A partial cross-sectional view of a resin multilayer substrate 102 in the present preferred embodiment is shown in FIG. 12.

Resin multilayer substrate 102 includes first resin layer 21 including a thermoplastic resin as a main material, second resin layer 22 including a thermoplastic resin as a main material and superposed on first resin layer 21, first interlayer-connection conductor 61 passing through first resin layer 21 in the thickness direction, and a first conductor pattern 71i disposed at an area including a region in which first interlayer-connection conductor 61 is exposed at the surface of first resin layer 21 between first resin layer 21 and second resin layer 22. First conductor pattern 71i includes a first portion covering the region where first interlayer-connection conductor 61 is exposed at the surface of first resin layer 21, and includes a second portion surrounding the first portion. The first portion and the second portion have different thicknesses from each other.

In the present preferred embodiment, the second portion is thinner than the first portion, and the surface of the second portion adjacent to first resin layer 21 is recessed in the thickness direction compared to the surface of the first portion adjacent to first resin layer 21.

The present preferred embodiment also achieves the advantageous effects similar to those of Preferred Embodiment 1. Note that, in the present preferred embodiment, the second portion around the first portion is thinner than the first portion, and therefore, the conductive paste that has oozed is easier to collect in portion 10i shown in FIG. 12. That is, in the step of integrating the stacked body by applying pressure to the stacked body while heating it to a temperature equal to or higher than the softening temperature of the thermoplastic resin of first resin layer 21 and second resin layer 22, a gap between the resin layers is easily filled between first conductor pattern 71i and another conductor pattern around first conductor pattern 71i. Thus, the conductive paste that has oozed into portion 10i is prevented from spreading to the outside.

With reference to FIG. 13 to FIG. 17, a non-limiting example of a method of manufacturing a resin multilayer substrate in Preferred Embodiment 2 according to the present invention is described. FIG. 3, FIG. 4, and FIG. 12 are also referred to again. This manufacturing method is to provide resin multilayer substrate 102. The method of manufacturing a resin multilayer substrate in the present preferred embodiment is a manufacturing method within the scope of the flowchart shown in FIG. 3.

This method is the same or substantially the same as the method described in Preferred Embodiment 1 in that, as step S2, as shown in FIG. 4, a stack is prepared in which resin sheet 12 is disposed on a surface of PET film 13 and copper foil 14 is disposed on a surface of resin sheet 12 opposite from PET film 13.

Figure 13:
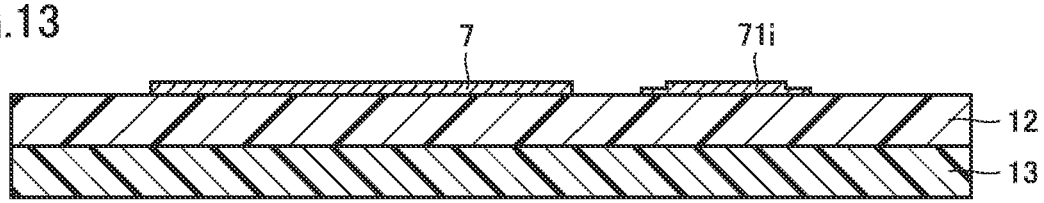
FIG. 13 is an illustrative diagram of a first step of a method of manufacturing a resin multilayer substrate in Preferred Embodiment 2 according to the present invention.
Figure 14:
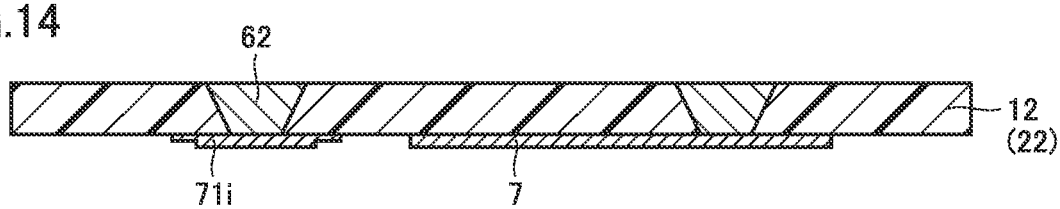
FIG. 14 is an illustrative diagram of a second step of the method of manufacturing a resin multilayer substrate in Preferred Embodiment 2 according to the present invention.

By performing steps S5 and S6, a structure shown in FIG. 13 is obtained. First conductor pattern 71i is the remainder as a result of the partial removal of original conductor pattern 7. From the state shown in FIG. 13, a structure shown in FIG. 14 is obtained by forming a through-hole by, for example, laser machining; filling the through-hole with a conductive paste; and removing PET film 13. Second resin layer 22 shown in FIG. 14 includes first conductor pattern 71i and second interlayer-connection conductor 62. There may also be another conductor pattern 7 that does not include a reduced-thickness portion.

Figure 15:
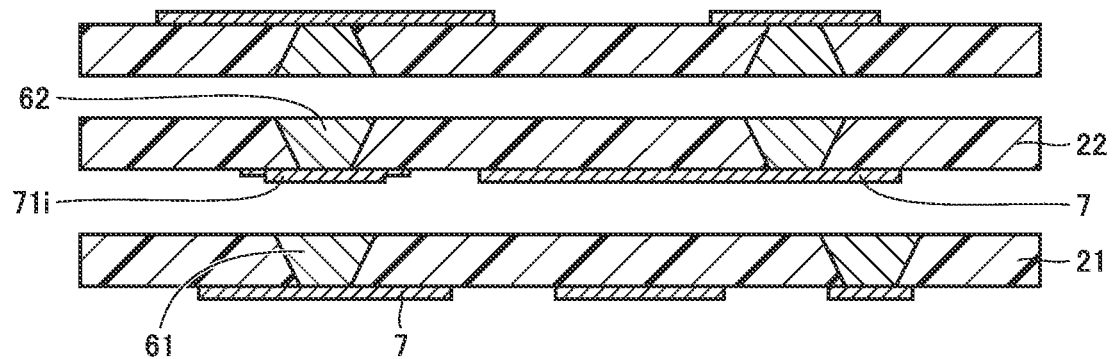
FIG. 15 is an illustrative diagram of a third step of the method of manufacturing a resin multilayer substrate in Preferred Embodiment 2 according to the present invention.

As step S7, as shown in FIG. 15, second resin layer 22 is superposed on first resin layer 21. At this time, a resin layer other than these two resin layers may also be superposed.

Figure 16:
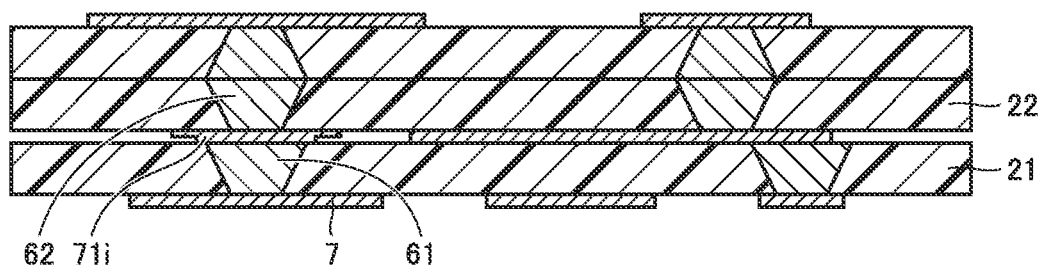
FIG. 16 is an illustrative diagram of a fourth step of the method of manufacturing a resin multilayer substrate in Preferred Embodiment 2 according to the present invention.
Figure 17:
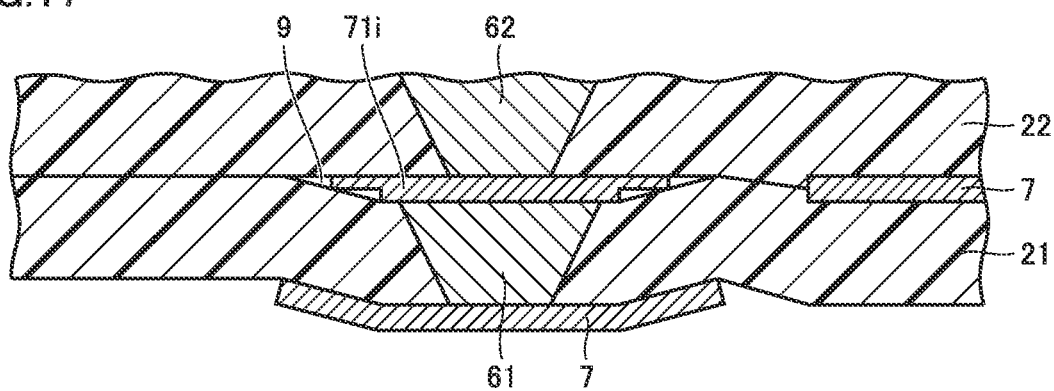
FIG. 17 is an illustrative diagram of a fifth step of the method of manufacturing a resin multilayer substrate in Preferred Embodiment 2 according to the present invention.

The stacked state is shown in FIG. 16. First conductor pattern 71i and its vicinity when a further pressure is applied to this stacked body is shown in FIG. 17 in an enlarged view. Gap 9 is created under the outer peripheral portion of first conductor pattern 71i.

As step S8, stacked body 1 is subjected to pressure while being heated to a temperature equal to or higher than the softening temperature of the thermoplastic resin. At this time, the conductive paste that has oozed from first interlayer-connection conductor 61 is disposed in gap 9 under first conductor pattern 71i. As a result, a portion 10i is formed under first interlayer-connection conductor 61 as shown in FIG. 12. Portion 10i may be formed of the conductive paste alone or may be formed of a mixture of the conductive paste and other materials.

In the present preferred embodiment, a case in which a step is preferably formed at the entire or substantially the entire outer circumference of first conductor pattern 71i has been described. However, a step may be formed only at a portion of the outer circumference of the first conductor pattern at which a problem of short-circuit failure with an adjacent electric conductor is likely to arise. Specifically, the second portion having a reduced thickness may be formed only at a portion of the outer circumference of the first conductor pattern at which the distance from an adjacent electric conductor is set to a certain distance or less. The second portion may be formed only at a portion of the outer circumference of one first conductor pattern.

Preferred Embodiment 3

Figure 18:
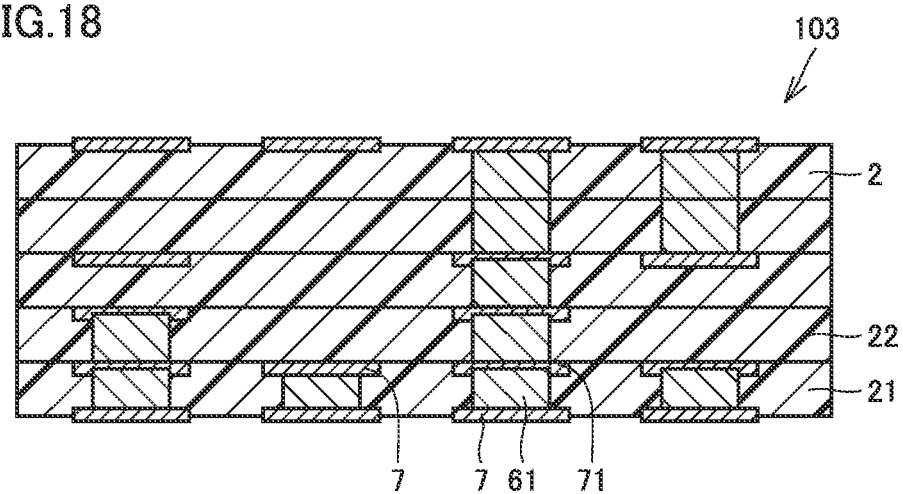
FIG. 18 is a cross-sectional view of a resin multilayer substrate in Preferred Embodiment 3 according to the present invention.

With reference to FIG. 18, a resin multilayer substrate in Preferred Embodiment 3 according to the present invention is described. A cross-sectional view of a resin multilayer substrate 103 in the present preferred embodiment is shown in FIG. 18.

Resin multilayer substrate 103 includes first resin layer 21 including a thermoplastic resin as a main material, second resin layer 22 including the thermoplastic resin as a main material and superposed on first resin layer 21, first interlayer-connection conductor 61 passing through first resin layer 21 in the thickness direction, and first conductor pattern 71 disposed at an area including a region in which first interlayer-connection conductor 61 is exposed at the surface of first resin layer 21 between first resin layer 21 and second resin layer 22. First conductor pattern 71 includes a portion that in or at which a portion of first interlayer-connection conductor 61 disposed. In the present preferred embodiment, as shown in FIG. 18, first conductor pattern 71 is provided with a recess portion. The upper end and portions adjacent to first interlayer-connection conductor 61 is fitted into this recess portion and is disposed therein.

What is disposed in or at first conductor pattern 71 may be only a portion of a low-melting metal contained in the conductive paste defining first interlayer-connection conductor 61, as described in Preferred Embodiment 1. However, what is disposed in or at first conductor pattern 71 is not limited to a specific component included in the conductive paste. As shown in the present preferred embodiment, a portion of the conductive paste defining first interlayer-connection conductor 61 that is located near first conductor pattern 71 may be wholly disposed therein or thereat.

The present preferred embodiment also achieves the advantageous effects described in Preferred Embodiment 1. Further, in the present preferred embodiment, first conductor pattern 71 includes a portion in or at which first interlayer-connection conductor 61 is disposed. With a portion of first interlayer-connection conductor 61 disposed in or at this portion, the total dimension of first interlayer-connection conductor 61 and first conductor pattern 71 in the thickness direction is able to be reduced. Therefore, in an outermost surface of the resin multilayer substrate, a portion corresponding to first interlayer-connection conductor 61 is prevented from producing a local convex portion.

The present preferred embodiment describes a case in which a recess portion is provided at the lower surface of a conductor pattern and in which this recess portion the upper end and its neighborhood of an interlayer-connection conductor that is in contact with this conductor pattern from below is disposed. However, the upper-lower relationship may be inversed. That is, the recess portion may be provided at the upper surface of a conductor pattern, and the lower end and portions adjacent to an interlayer-connection conductor that is in contact with this conductor pattern from above may be disposed in this recess portion.

As shown in FIG. 18, it is preferred that resin multilayer substrate 103 includes a series-connection portion in which a larger number of interlayer-connection conductors are disposed on top of one another compared to the other portion in resin multilayer substrate 103, and that first conductor pattern 71 is included in the series-connection portion. In the example shown in FIG. 18, four groups are shown in the horizontal direction, among which the second group from the right defines such a series-connection portion. At such a series-connection portion in which a larger number of interlayer-connection conductors are disposed on top of one another compared to the other portion, there is a concern that a convex portion might be provided in an outermost surface of the resin multilayer substrate. In the present preferred embodiment, however, the problem of a convex portion is effectively prevented because the first conductor pattern is included in the series-connection portion. The same applies to other preferred embodiments described below.

Figure 19:
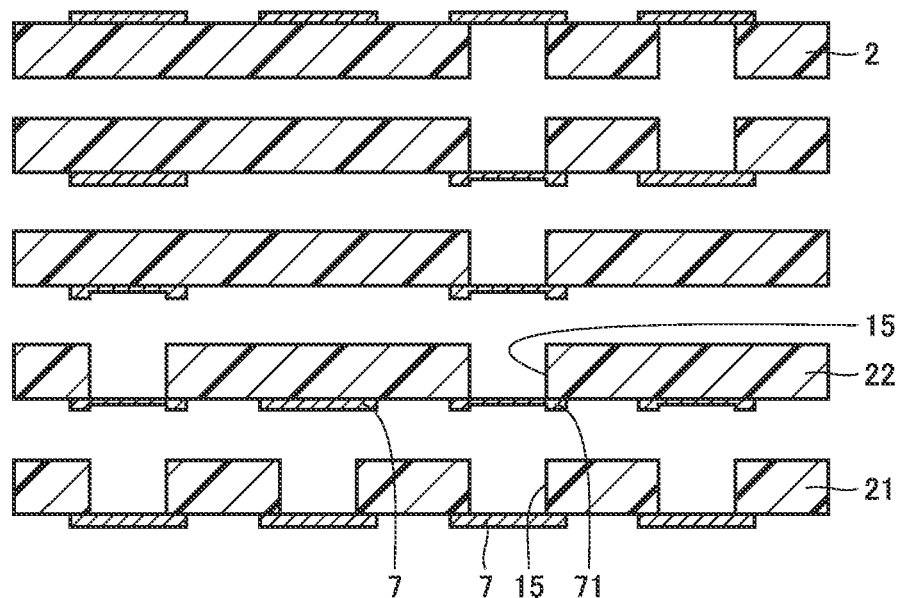
FIG. 19 is an illustrative diagram of a first step of a method of manufacturing a resin multilayer substrate in Preferred Embodiment 3 according to the present invention.
Figure 20:
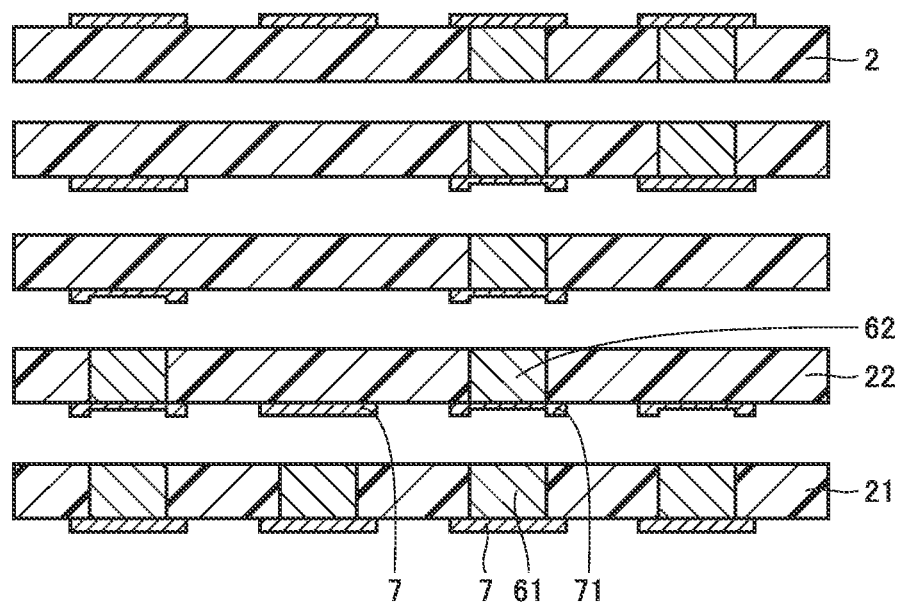
FIG. 20 is an illustrative diagram of a second step of the method of manufacturing a resin multilayer substrate in Preferred Embodiment 3 according to the present invention.

With reference to FIG. 19 to FIG. 20, a non-limiting example of a method of manufacturing a resin multilayer substrate in Preferred Embodiment 3 according to the present invention is described. This manufacturing method is to provide resin multilayer substrate 103 (see FIG. 18). Basically, resin multilayer substrate 103 is produced by stacking a plurality of resin layers 2. For the purpose of illustration, however, a specific one of a plurality of resin layers 2 is described as first resin layer 21, and another specific one layer is described as second resin layer 22. Each of first resin layer 21 and second resin layer 22 is one type of resin layer 2.

As shown in FIG. 19, in the method of manufacturing a resin multilayer substrate in the present preferred embodiment, a conductor pattern is formed by patterning a copper foil on a surface of each resin layer 2. A reduced-thickness portion is formed partially in the conductor pattern by, for example, half-etching. Further, through-hole 15 is formed by, for example, laser machining. Although in the description herein the formation of the conductor pattern is performed first, the order is not limited as such. Either one of the formation of the conductor pattern and the formation of through-hole 15 may precede the other. Next, as shown in FIG. 20, a conductor paste, which is to be formed into an interlayer-connection conductor, is provided in each through-hole 15 of each resin layer 2. In FIG. 20, first interlayer-connection conductor 61 is formed in first resin layer 21, and second interlayer-connection conductor 62 is formed in second resin layer 22. By stacking these resin layers and applying heat and pressure to the stacked resin layers, resin multilayer substrate 103 shown in FIG. 18 is able to be obtained.

The present preferred embodiment achieves a resin multilayer substrate that does not include a local convex portion on its surface and, thus, has excellent flatness, while preventing a short-circuit failure due to the oozing of the conductive paste.

Preferred Embodiment 4

Figure 21:
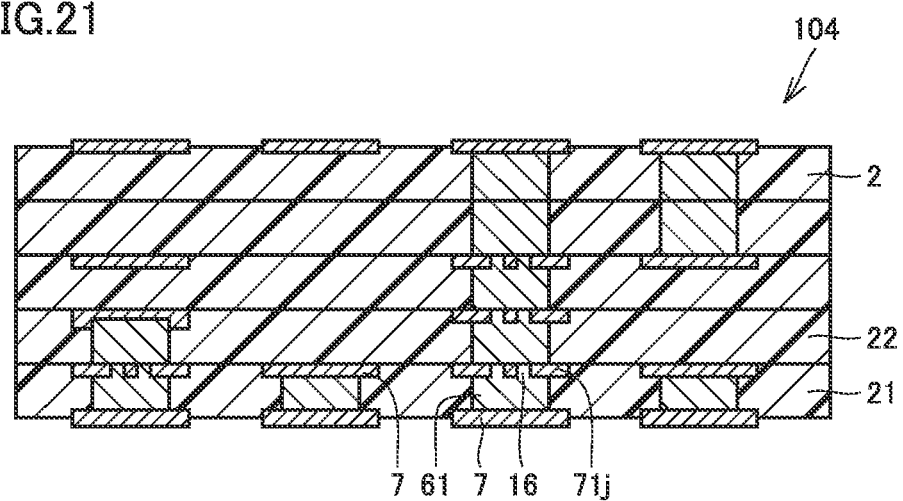
FIG. 21 is a cross-sectional view of a resin multilayer substrate in Preferred Embodiment 4 according to the present invention.

With reference to FIG. 21, a resin multilayer substrate in Preferred Embodiment 4 according to the present invention is described. A cross-sectional view of a resin multilayer substrate 104 in the present preferred embodiment is shown in FIG. 21. Resin multilayer substrate 104 includes a first conductor pattern 71*j*. In the present preferred embodiment, first conductor pattern 71*j* includes a conductor pattern through-hole 16, which is a through-hole disposed so that at least a portion of the through-hole overlaps a region in which first interlayer-connection conductor 61 is exposed at the surface of first resin layer 21. Conductor pattern through-hole 16 may partially overlap first interlayer-connection conductor 61, or conductor pattern through-hole 16 may wholly overlap first interlayer-connection conductor 61.

In the present preferred embodiment, first conductor pattern 71*j* includes conductor pattern through-hole 16, and at least a portion of conductor pattern through-hole 16 overlaps a region in which first interlayer-connection conductor 61 is exposed at the surface of first resin layer 21. With a portion of first interlayer-connection conductor 61 disposed in conductor pattern through-hole 16, the dimension in the thickness direction is able to be reduced. Therefore, in an outermost surface of the resin multilayer substrate, a portion corresponding to first interlayer-connection conductor 61 is prevented from including a local convex portion.

Figure 22:
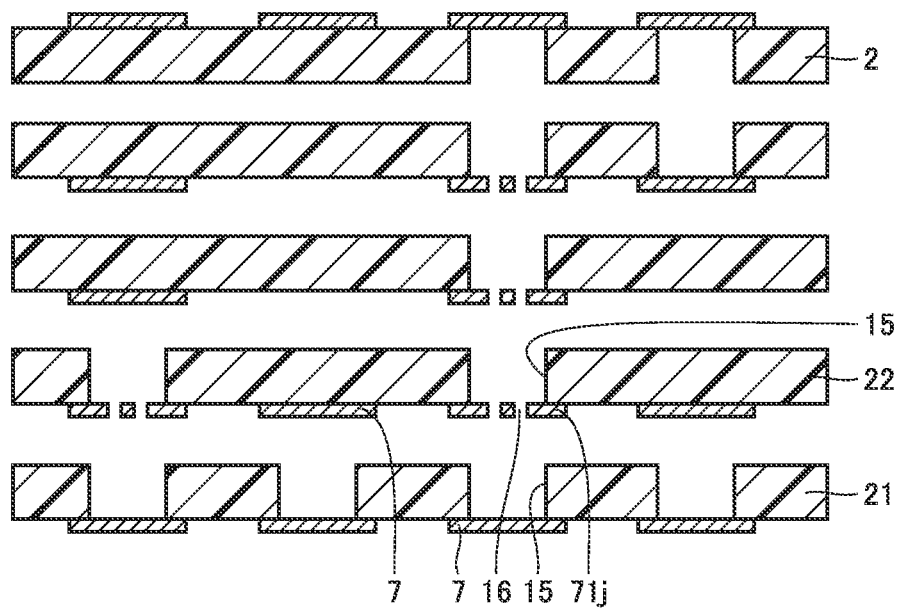
FIG. 22 is an illustrative diagram of a method of manufacturing a resin multilayer substrate in Preferred Embodiment 4 according to the present invention.

With reference to FIG. 22 to FIG. 23, a non-limiting example of a method of manufacturing a resin multilayer substrate in Preferred Embodiment 4 according to the present invention is described. This manufacturing method is to provide resin multilayer substrate 104 (see FIG. 21).

As shown in FIG. 22, in the method of manufacturing a resin multilayer substrate in the present preferred embodiment, a conductor pattern is formed by patterning a copper foil on a surface of each resin layer 2. Conductor pattern through-hole 16 is formed partially in the conductor pattern. A known technology, such as laser machining, may be used to form conductor pattern through-hole 16.

A flowchart of the method of manufacturing a resin multilayer substrate in the present preferred embodiment is shown in FIG. 23.

The method of manufacturing a resin multilayer substrate includes a step S1 of preparing a first resin layer including a thermoplastic resin as a main material; a step S2 of preparing a second resin layer including the thermoplastic resin as a main material and including a surface with a conductive film disposed thereon; a step S13 of forming a first through-hole in the first resin layer; a step S14 of providing a conductive paste in the first through-hole; a step S5 of forming a conductor pattern by patterning the conductive film of the second resin layer; a step S16 of forming a second through-hole in the conductor pattern; a step S7 of superposing the second resin layer on the first resin layer so that the conductor pattern covers a region of a surface of the first resin layer where the first through-hole is exposed, with at least a portion of the second through-hole overlapping the exposed region; and a step S8 of integrating a stacked body including the first resin layer and the second resin layer by applying pressure to the stacked body while heating it to a temperature equal to or higher than the softening temperature of the thermoplastic resin. When applied to the example shown in FIG. 21 to FIG. 22, through-hole 15 formed in resin layer 2 corresponds to "first through-hole", and conductor pattern through-hole 16 formed in first conductor pattern 71j corresponds to "second through-hole".

The present preferred embodiment achieves a resin multilayer substrate that does not include local convex portion on its surface and, thus, has excellent flatness, while preventing a short-circuit failure due to the oozing of the conductive paste.

More than one of the above preferred embodiments may be used in combination as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate including a stacked body, the stacked body comprising:
    a plurality of resin layers including:
        a first resin layer including a thermoplastic resin as a main material; and
        a second resin layer including a thermoplastic resin as a main material and superposed on the first resin layer;
    a first interlayer-connection conductor passing through the first resin layer in a thickness direction; and
    a first conductor pattern disposed at an area including a region in which the first interlayer-connection conductor is exposed at a surface of the first resin layer between the first resin layer and the second resin layer;
    wherein
    the first interlayer-connection conductor extends into or passes through the first conductor pattern;
    the stacked body includes a first main surface, and a second main surface on a side opposite to the first main surface;
    the stacked body includes a series-connection portion in which a plurality of interlayer-connection conductors are disposed on top of one another;
    the first conductor pattern and the first interlayer-connection conductor are included in the series-connection portion;
    the first conductor pattern is disposed inside the stacked body;
    a metallic foil pattern is provided on each of the first main surface and the second main surface of the stacked body in a position overlapping the series-connection portion; and
    the series-connection portion includes, at an end thereof, a second conductor pattern with a recess in which a second interlayer-connection conductor, included in the series-connection portion, extends into.

2. The resin multilayer substrate according to claim 1, wherein
    the first conductor pattern includes:
        a first portion disposed covering the region where the first interlayer-connection conductor is exposed at the surface of the first resin layer; and
        a second portion surrounding the first portion; and
    the first portion and the second portion have different thicknesses from each other.

3. The resin multilayer substrate according to claim 1, wherein the first interlayer-connection conductor includes an added metal having a melting point lower than a softening temperature of the thermoplastic resin included in the first resin layer and the second resin layer.

4. The resin multilayer substrate according to claim 1, wherein the thermoplastic resin included in the first resin layer and the second resin layer is a liquid crystal polymer resin.

5. The resin multilayer substrate according to claim 1, wherein the first conductor pattern is defined by a copper foil.

6. The resin multilayer substrate according to claim 1, wherein the series-connection portion is connected to one of the first main surface and the second main surface.

7. The resin multilayer substrate according to claim 1, wherein the first conductor pattern includes a conductor pattern through-hole, and a portion of the through-hole overlaps the region in which the first interlayer-connection conductor is exposed at the surface of the first resin layer.

8. The resin multilayer substrate according to claim 2, wherein
    the first portion is thinner than the second portion; and
    a surface of the first portion adjacent to the first resin layer is recessed in a thickness direction compared to a surface of the second portion adjacent to the first resin layer.

9. The resin multilayer substrate according to claim 2, wherein
    the second portion is thinner than the first portion; and
    a surface of the second portion adjacent to the first resin layer is recessed in a thickness direction compared to a surface of the first portion adjacent to the first resin layer.

10. The resin multilayer substrate according to claim 3, wherein the added metal is Sn.

11. The resin multilayer substrate according to claim 7, wherein the conductor pattern through-hole is located closer to a center of the first interlayer-connection conductor than to an outer periphery of the first interlayer-connection conductor.

12. The resin multilayer substrate according to claim 7, wherein
    the conductor pattern through-hole wholly overlaps the first interlayer-connection conductor;
    a portion of the first interlayer-connection conductor is disposed in the conductor pattern through-hole; and
    a portion of the first conductor pattern surrounding the conductor pattern through-hole overlaps with a portion of the first interlayer-connection conductor.

13. The resin multilayer substrate according to claim 12, wherein
    the first conductor pattern includes:
        a first portion disposed covering the region where the first interlayer-connection conductor is exposed at the surface of the first resin layer; and
        a second portion surrounding the first portion; and
    the first portion and the second portion have different thicknesses from each other.

14. The resin multilayer substrate according to claim 12, wherein the first interlayer-connection conductor includes an added metal having a melting point lower than a softening temperature of the thermoplastic resin included in the first resin layer and the second resin layer.

15. The resin multilayer substrate according to claim 12, wherein the thermoplastic resin included in the first resin layer and the second resin layer is a liquid crystal polymer resin.

16. The resin multilayer substrate according to claim 12, wherein the first conductor pattern is defined by a copper foil.

17. The resin multilayer substrate according to claim 13, wherein
  the first portion is thinner than the second portion; and
  a surface of the first portion adjacent to the first resin layer is recessed in a thickness direction compared to a surface of the second portion adjacent to the first resin layer.

18. The resin multilayer substrate according to claim 13, wherein
  the second portion is thinner than the first portion; and
  a surface of the second portion adjacent to the first resin layer is recessed in a thickness direction compared to a surface of the first portion adjacent to the first resin layer.

19. The resin multilayer substrate according to claim 14, wherein the added metal is Sn.

\* \* \* \* \*